(12) United States Patent
Chen et al.

(10) Patent No.: US 7,086,458 B2
(45) Date of Patent: Aug. 8, 2006

(54) HEAT SINK STRUCTURE WITH FLEXIBLE HEAT DISSIPATION PAD

(75) Inventors: Wei-Liang Chen, Taoyuan Hsien (TW); Wei-Ming Wu, HsinChu Hsien (TW)

(73) Assignee: Uniwill Computer Corp., Chungli (TW)

( * ) Notice: Subject to any disclaimer, the term of this patent is extended or adjusted under 35 U.S.C. 154(b) by 249 days.

(21) Appl. No.: 10/628,334

(22) Filed: Jul. 29, 2003

(65) Prior Publication Data

US 2005/0022969 A1   Feb. 3, 2005

(51) Int. Cl.
*F28F 7/00* (2006.01)

(52) U.S. Cl. ............ 165/185; 165/104.33; 165/104.21; 361/697; 361/700; 361/704; 257/714; 174/15.2

(58) Field of Classification Search ............... 165/80.3, 165/185, 104.19, 104.21, 104.33; 361/704, 361/703, 710
See application file for complete search history.

(56) References Cited

U.S. PATENT DOCUMENTS

| | | | | |
|---|---|---|---|---|
| 4,479,140 A | * | 10/1984 | Horvath | 257/713 |
| 5,159,531 A | * | 10/1992 | Horvath et al. | 361/704 |
| 5,287,001 A | * | 2/1994 | Buchmann et al. | 257/719 |
| 5,548,090 A | * | 8/1996 | Harris | 174/252 |
| 5,560,423 A | * | 10/1996 | Larson et al. | 165/104.26 |
| 6,060,166 A | * | 5/2000 | Hoover et al. | 428/408 |
| 6,226,184 B1 | * | 5/2001 | Stolz et al. | 361/704 |
| 6,257,328 B1 | * | 7/2001 | Fujiwara et al. | 165/185 |
| 6,328,097 B1 | * | 12/2001 | Bookhardt et al. | 165/104.33 |
| 6,373,700 B1 | * | 4/2002 | Wang | 361/698 |
| 6,408,934 B1 | * | 6/2002 | Ishida et al. | 165/80.3 |
| 6,462,952 B1 | * | 10/2002 | Ubukata et al. | 361/719 |
| 6,545,352 B1 | * | 4/2003 | Ruckdeschel | 257/718 |
| 6,566,879 B1 | * | 5/2003 | Vanek et al. | 324/318 |
| 6,678,159 B1 | * | 1/2004 | Barcley | 361/704 |
| 6,721,182 B1 | * | 4/2004 | Wells et al. | 361/704 |
| 6,894,908 B1 | * | 5/2005 | Clark et al. | 361/825 |

FOREIGN PATENT DOCUMENTS

| | | | | |
|---|---|---|---|---|
| DE | 40 04 457 | * | 8/1991 | 165/185 |
| DE | 199 25 983 | * | 12/2000 | 165/185 |

* cited by examiner

*Primary Examiner*—Terrell McKinnon
(74) *Attorney, Agent, or Firm*—Alan D. Kamrath; Nikolai & Mersereau, P.A.

(57) ABSTRACT

A heat sink module includes a heat dissipation pad. The heat dissipation pad is flexible and has a cambered shape, and is pressed to become a flat plate when disposed between the heat sink module and a CPU. The heat dissipation pad restores to its original cumbered shape and lifts the heat sink module away from a CPU when a fixing device that fixes the heat sink module to the CPU is disabled. Therefore, one can easily removes the heat sink module without any additional tools or processes.

13 Claims, 3 Drawing Sheets

HEAT SINK STRUCTURE WITH FLEXIBLE HEAT DISSIPATION PAD

BACKGROUND OF THE INVENTION

1. Field of the Invention

The invention relates to an improvement of a heat sink module and, in particular, to a heat sink module having a flexible heat dissipation pad to facilitate the assembling of the heat sink module to a CPU without damaging the surface of the CPU.

2. Description of the Related Art

Conventionally, a phase-change heat dissipation pad melts due to the heat generated by the CPU. After the electronic devices being turned off, the phase-change heat dissipation pad would cool down and binds the heat sink module to the CPU tightly. Since the heat sink module is bonded to the CPU, it is hard the separate the heat sink module from the CPU. The CPU tends to be pulled out together with the heat sink module, which results in the distortion or breakage of the CPU pins. In view of this, it is necessary to have someone to deal with the CPUs with the distorted or broken pins, which requires additional manpower and enhances the manufacturing cost.

A heat sink module often needs to be disassembled due to rework or maintenance purposes. Since the heat dissipation pad is melted, it needs to be replaced to keep normal heat dissipation effects. Furthermore, in view of the highly changeable demands of the market, the CPU must be disassembled to replace a new heat dissipation pad after quality test and before shipping. During such operation procedure, the heat dissipation pad may be replaced two to four times. If the cost of a heat dissipation pad is 6.3 dollars, it is necessary to pay an extra cost of 12.6 to 25.2 dollars. This extra cost does not include the costs incurred by the carelessness of the workers.

Since the heat sink module is bonded to the CPU via the heat dissipation pad, an additional tool is needed to disassemble the heat sink module. Furthermore, one needs to clean the wax on the surface of the CPU, re-apply the heat sink paste, and attach a new heat dissipation pad. These operations require an additional worker and extra work hours (about 30 minutes), and the worker may taint the housing of the electronic device since he/she may touch the heat sink paste when applying the heat sink paste and replacing the heat dissipation pad. The QA department or the customers may reject the products due to the tainted appearance. This would results in extra costs, not to say the additional tools, the additional manufacturing process, and the probable additional molding process if the housing needs to be reworked.

SUMMARY OF THE INVENTION

In view of the above, an objective of the invention is to provide an improved heat sink module, which would facilitate the disassembly of the heat sink module and to protect the surface of the CPU to prolong its life.

Another objective of the invention is to provide an improved heat sink module, which would reduce the cost due to rework, maintenance or the replacements of the heat dissipation pads. Furthermore, it would avoid the housing of a electronic device to be tainted.

To achieve the above objectives, the heat sink module according to the invention includes a heat dissipation pad. The heat dissipation pad is flexible and has a cambered shape, and is pressed to become a flat plate when disposed between the heat sink module and a CPU. The heat dissipation pad restores to its original cumbered shape and lifts the heat sink module away from a CPU when a fixing device that fixes the heat sink module to the CPU is disabled. Therefore, one can easily removes the heat sink module without any additional tools or processes, thus solves the problems in the prior art.

DETAILED DESCRIPTION OF THE PREFERRED EMBODIMENTS

Figure 1:
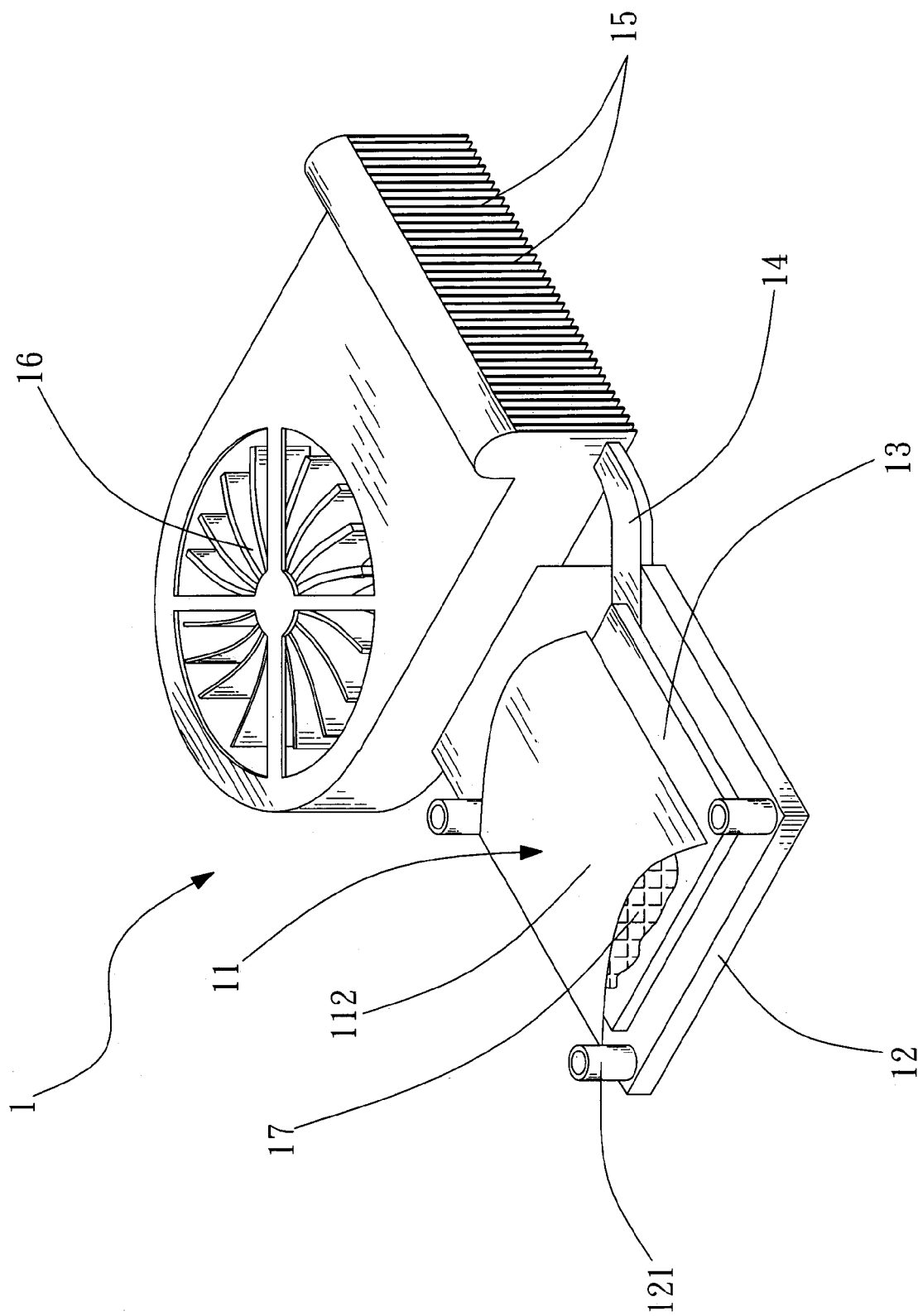
FIG. 1 is a perspective schematic diagram showing a heat sink module according a preferred embodiment of the invention.

FIG. 1 is a perspective schematic diagram showing a heat sink module according a preferred embodiment of the invention. As shown in FIG. 1, the heat sink module 1 includes a heat dissipation pad 11, a base 12, a heat conducting plate 13, a heat pipe 14, a plurality of heat dissipation fins 15, a fan 16 and a heat dissipation paste 17. The heat dissipation pad 11 is disposed between the heat sink module 1 and a CPU 21 (not shown in the figure), and has a flexible portion 112. The flexible portion 112 is in a shape of a cambered plate, and can lift the heat sink module 1 when disassembling the heat sink module 1 from the CPU 21. The material of the flexible portion 112 may be heat dissipation material (such as copper).

The base 12 of the heat sink module 1 has a fixing device 121. The fixing device 121 fixes the heat sink module 1 in a portable electronic device, and the heat conducting plate 13 is fixed to the base 12. When the heat sink module 1 is fixed in the portable electronic device, the heat conducting plate 13 and the heat dissipation pad 11 is pressed with each other tightly, and the heat pipe 14 is coupled to the heat conducting plate 13. The heat pipe 14 brings away the heat accumulated at the heat conducting plate 13, and the heat dissipation fins 15 is coupled with the other end of the heat pipe 14 to increase the heat dissipation surface area. The fan 16 is provided beside the heat dissipation fins 15 to enhance the heat dissipation efficiency so as to avoid the over-high temperature. When the heat sink module 1 is provided inside the portable electronic device, to prevent the clearance between the heat dissipation pad 11 and the heat conducting plate 13, heat dissipation paste 17 is applied between the heat dissipation pad 11 and the heat conducting plate 13 to enhance the heat dissipation efficiency.

Figure 2A:
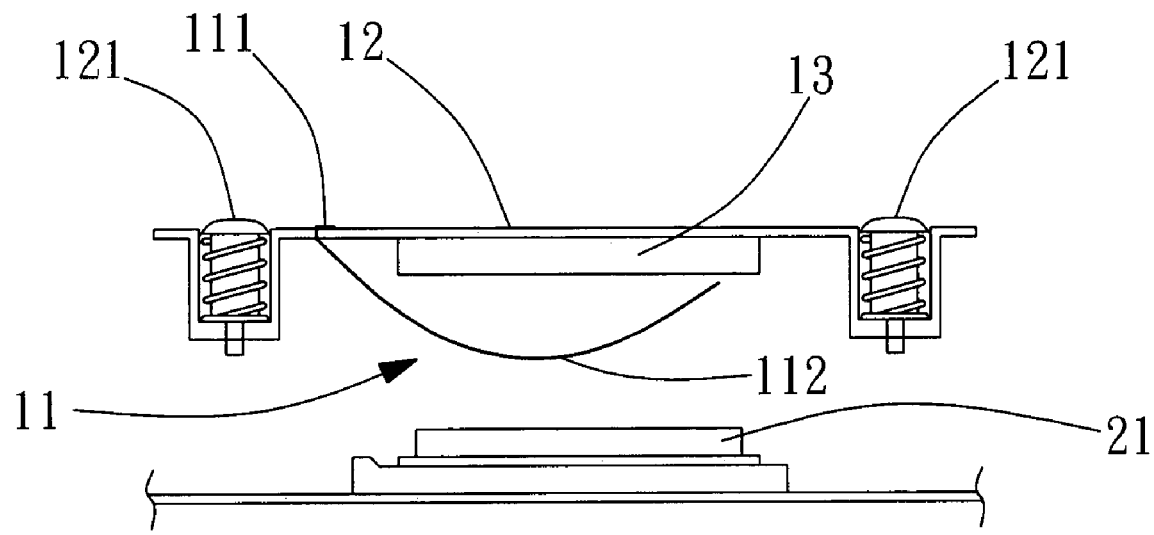
FIG. 2A is a partial side view illustrating the corresponding relationship between a CPU and the heat sink module according to the preferred embodiment of the invention.

FIG. 2A is a partial side view illustrating the corresponding relationship between the CPU 21 and the heat sink module 1 mentioned above. The heat sink module 1 shown in FIG. 2A is not assembled with the CPU 21, and the flexible portion 112 of the heat dissipation pad 11 remains in a shape of a cambered plate. A fixing portion 111 is provided at one side of the heat dissipation pad 11 to fix the heat dissipation pad 11 to one side of the base 12.

Figure 2B:
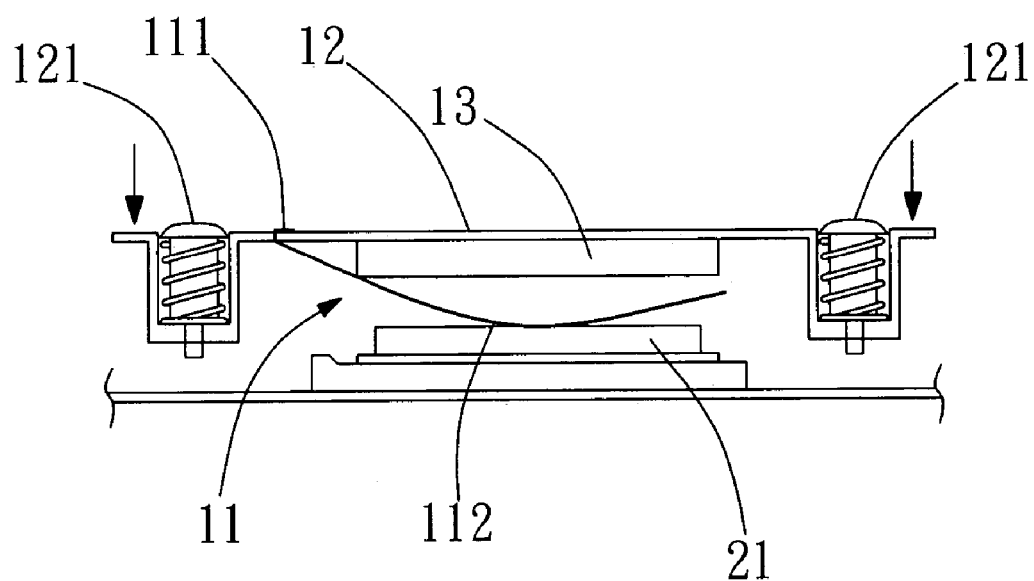
FIG. 2B is a schematic diagram showing the assembling procedure of the heat sink module according to the preferred embodiment of the invention.

FIG. 2B is a schematic diagram showing the assembling procedure of the heat sink module according to the preferred embodiment of the invention. The flexible portion 112 of the heat dissipation pad 11 is pressed against the CPU 21, and is deformed accordingly due to the pressing force.

Figure 2C:
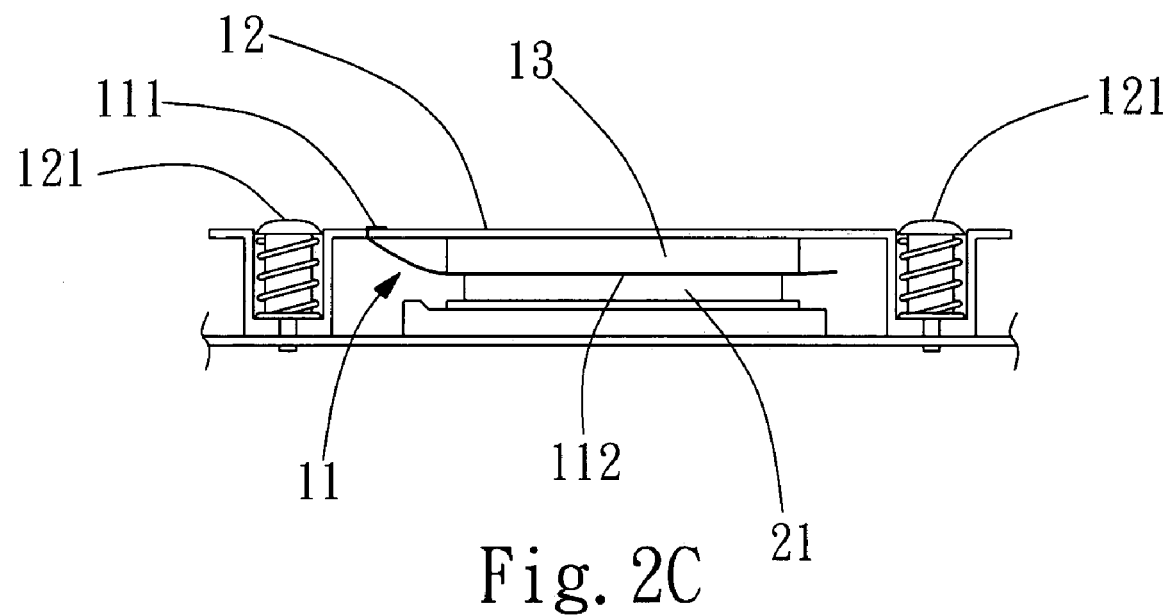
FIG. 2C is a schematic diagram showing heat sink module assembled with the CPU according to the preferred embodiment of the invention.

FIG. 2C is a schematic diagram showing heat sink module assembled with the CPU according to the preferred embodiment of the invention. In FIG. 2C, the flexible portion 112 of the heat dissipation pad 11 is pressed against the CPU 21 completely, and is substantially flat between the heat conducting plate 13 and the CPU 21.

Figure 2D:
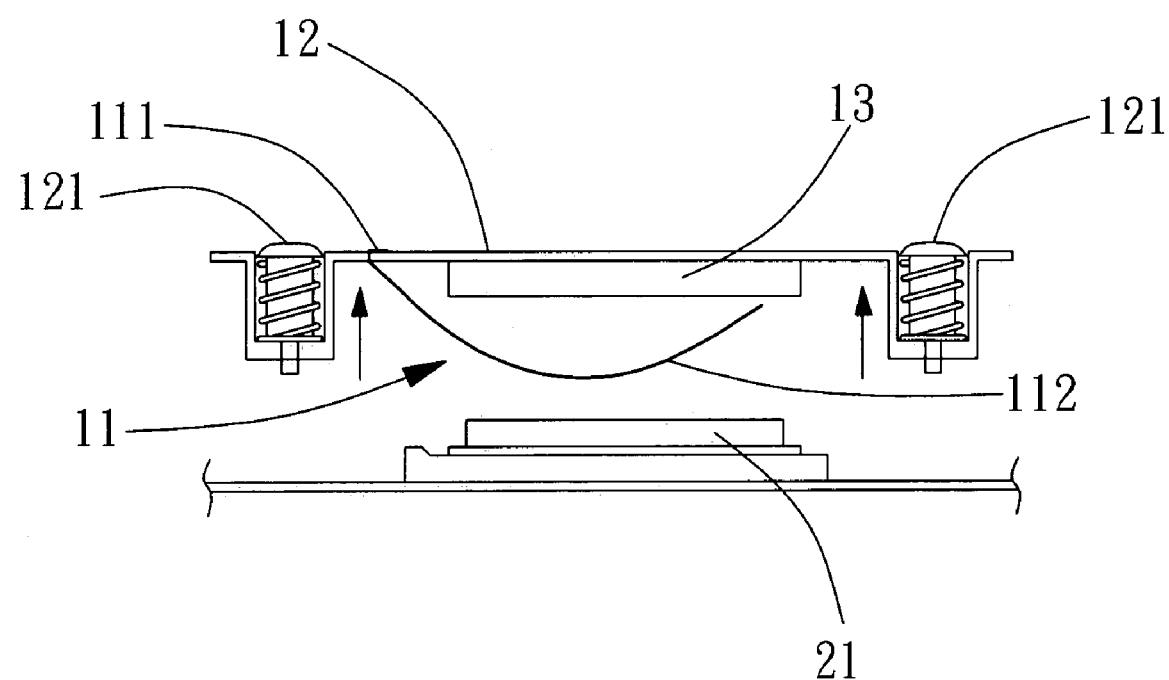
FIG. 2D is a schematic diagram showing the disassembling procedure of the heat sink module according to the preferred embodiment of the invention.

FIG. 2D is a schematic diagram showing the disassembling procedure of the heat sink module according to the preferred embodiment of the invention. After the fixing device 121 is disabled, due to the resilience the flexible portion 112, the heat dissipation pad 11 restores into its original cumbered shape and lifts the heat sink module 1 away from the CPU 21 without damaging its surface. Therefore, one can easily removes the heat sink module 1 without any additional tools or processes.

The advantages of the invention are as follows:

1. Since the heat dissipation pad 11 has been treated with a heat treatment of 350 to 400 degrees centigrade during its manufacturing process, its elasticity would not be reduced due to the press force between the heat sink module 1 and the CPU 21 or the heat generated by the CPU 21. Therefore, the flexible heat dissipation pad 11 would restore to its original cambered shape even after assembled with the CPU 21 for a long time. Since the press force is disappeared after disabling the fixing device 121, the heat dissipation pad 11 would restore to its original cumbered shape and lifts the heat sink module I away from the CPU 21 without damaging its surface. Therefore, one can easily removes the heat sink module 1 without any additional tools or processes.

2. Since the heat dissipation pad 11 according to the invention may be made of copper, its heat conducting effect is similar to the conventional heat dissipation pads. The test results are very close under the same test environment. For example, using a 2.0 Hz CPU as a test platform, the temperature of the CPU using a conventional heat dissipation pad is 67 degrees centigrade, and the temperature of the CPU using the disclosed heat dissipation pad 11 is 68 degrees centigrade. Using a 1.8 GHz CPU as a test platform, the temperatures of the CPU using a conventional heat dissipation pad and using the disclosed heat dissipation pad 11 are about 77~78 degrees centigrade. Using a 2.8 GHz CPU as a test platform, the temperature of the CPU using a conventional heat dissipation pad is 75 degrees centigrade, and the temperature of the CPU using the disclosed heat dissipation pad 11 is 74 degrees centigrade. Since the operating time is the same and no abnormal events take place, it can be proved that the heat dissipation effects are almost the same.

3. Using the heat dissipation pad 11 according to the invention, no additional tools are required to remove the heat sink module from the CPU. Since different types of heat sink modules are required for different types of electronic devices, engineers often design various kinds of tools to remove the heat sink module 1 without damaging the CPU 21. With the heat dissipation pad 11 according to the invention, the costs of designing and using the additional tools can be saved. Moreover, the invention is also suitable for desktop computers and chipsets.

To sum up, the invention provides a heat sink module that resolves various problems in the prior art. Furthermore, the invention would reduce the cost due to rework, maintenance or the replacements of the heat dissipation pads.

While the invention has been described with reference to a preferred embodiment, this description is not intended to be construed in a limiting sense. Various modifications of the embodiment will be apparent to persons skilled in the art upon reference to the description. It is therefore intended that the appended claims encompass any such modifications.

What is claimed is:

1. A heat sink module, comprising:
   a base;
   a heat dissipation pad being flexible and biased to a cambered shape, the heat dissipation pad having a fixing portion coupled to the base and a flexible portion extending deflectively therefrom to terminate at a free end, wherein the flexible portion of the heat dissipation pad deflectable to a substantially flat configuration when captured between a heat conducting plate and a CPU; and
   a heat pipe, which one end connects the heat conducting plate to bring away heat accumulated at the heat conducting plate.

2. The heat sink module according to claim 1, wherein the base includes a fixing device, the fixing device fixing the heat sink module in a portable electronic device, wherein one side of the heat dissipation pad is positioned to one side of the base.

3. The heat sink module according to claim 2, wherein the portable electronic device is a notebook computer.

4. The heat sink module according to claim 2, wherein the portable electronic device is a tablet PC.

5. The heat sink module according to claim 2, wherein the portable electronic device is a personal digital assistant (PDA).

6. The heat sink module according to claim 1, wherein the heat conducting plate is fixed to the base and against the heat dissipation pad tightly when the heat sink module installed in a portable electronic device.

7. The heat sink module according to claim 1, further comprising:
   a plurality of heat dissipation fins connected to another end of the heat pipe.

8. The heat sink module according to claim 7, further comprising:
   a fan provided beside the plurality of heat dissipation fins.

9. The heat sink module according to claim 1, wherein the heat dissipation pad is in a shape of a plate.

10. The heat sink module according to claim 1, wherein the flexible portion of the heat dissipation pad is in a shape of a cambered plate.

11. The heat sink module according to claim 1, wherein the heat dissipation pad is made of heat dissipation material.

12. The heat sink module according to claim 1, wherein heat dissipation paste is applied between a heat conducting plate and the heat dissipation pad.

13. A heat sink module for a heat generating device comprising:
   a frame for supporting the heat generating device;
   a base detachably coupled to the frame;
   a heat dissipation pad releasably captured against the heat generating device by the base when the base is coupled to the frame, the heat dissipation pad having a fixing portion coupled to the base and a flexible portion extending deflectively therefrom to terminate at a free end, the flexible portion being biased to a cambered shape, the flexible portion being deflectable to a substantially flat configuration when captured by the base against the heat generating device, wherein the base includes a heat conducting plate, the flexible portion extending substantially over the heat conducting plate.

* * * * *